United States Patent
Goers et al.

(10) Patent No.: US 6,855,001 B2
(45) Date of Patent: Feb. 15, 2005

(54) MODULAR SYSTEM

(75) Inventors: Andreas Goers, Pattensen (DE); Helmut Michel, Hannover (DE); Reiner Bleil, Peine (DE)

(73) Assignee: ABB Patent GmbH, Mannheim (DE)

( * ) Notice: Subject to any disclaimer, the term of this patent is extended or adjusted under 35 U.S.C. 154(b) by 425 days.

(21) Appl. No.: 10/000,316

(22) Filed: Oct. 23, 2001

(65) Prior Publication Data

US 2002/0076989 A1 Jun. 20, 2002

(30) Foreign Application Priority Data

Oct. 24, 2000 (DE) .......................................... 100 52 619

(51) Int. Cl.$^7$ ............................................... H01R 3/00
(52) U.S. Cl. ...................................... 439/489; 361/788
(58) Field of Search ........................... 439/489, 61, 95, 439/955, 692; 361/788

(56) References Cited

U.S. PATENT DOCUMENTS

| | | | | |
|---|---|---|---|---|
| 4,511,950 A | * | 4/1985 | Bunner et al. | 361/788 |
| 4,686,607 A | * | 8/1987 | Johnson | 361/788 |
| 4,703,394 A | * | 10/1987 | Petit et al. | 361/790 |
| 5,006,961 A | * | 4/1991 | Monico | 361/788 |
| 5,352,123 A | * | 10/1994 | Sample et al. | 439/61 |
| 5,547,386 A | * | 8/1996 | Fredberg | 439/61 |
| 5,990,981 A | * | 11/1999 | Thompson et al. | 348/705 |
| 6,392,142 B1 | * | 5/2002 | Uzuka et al. | 174/52.1 |
| 6,496,376 B1 | * | 12/2002 | Plunkett et al. | 361/729 |
| 6,517,375 B2 | * | 2/2003 | MacLaren et al. | 439/489 |
| 6,553,555 B1 | * | 4/2003 | Green et al. | 716/15 |
| 6,608,762 B2 | * | 8/2003 | Patriche | 361/788 |
| 6,672,878 B2 | * | 1/2004 | Dean | 439/67 |

* cited by examiner

Primary Examiner—Michael C. Zarroli
(74) Attorney, Agent, or Firm—Michael M. Rickin, ESq.; Paul R. Katterle, Esq.

(57) ABSTRACT

The invention relates to a modular system comprising an electrical base unit (1) with a plurality of slots each for receiving a pluggable electrical unit (2), each pluggable electrical unit (2) being connected to the base unit (1) by means of a multi-pin plug-in connection comprising a plug-in contact device (23) and a mating plug-in contact device (13) and the base unit (1) being provided with signal processing means (12). For this purpose, it is proposed to divide the plug-in contacts of the multi-pin plug-in connection (13, 23) into at least two groups (31, 32), a first group (31) of plug-in contacts being intended for the connection of permanently configured lines for the identification of the pluggable electrical unit (2) and a second group (32) of plug-in contacts being intended for the connection of freely configurable lines for the communication of the pluggable electrical unit (2) with the base unit (1), the direction of signal transmission and the logical signal assignment of these lines being predeterminable slot-specifically in accordance with the identity of the pluggable electrical unit (2) and able to be set as prescribed by the signal processing means (12) of the base unit (1).

13 Claims, 2 Drawing Sheets

MODULAR SYSTEM

BACKGROUND OF THE INVENTION

The invention relates to a modular system comprising an electrical base unit with a plurality of slots each for receiving a pluggable electrical unit, each pluggable electrical unit being electrically connected to the base unit by means of a multi-pin plug-in connection comprising a plug-in contact device and a mating plug-in contact device.

Complex electrical engineering systems, in particular in measuring and control technology and in telecommunications, are often of a modular construction. This involves a large number of electrical units being accommodated in an enclosure of an electrical base unit in a pluggable manner.

The base unit is often provided with rear wiring which connects all the mating plug-in contact devices, and may be configured as a cable harness, as a winding bridge or as a backplane. To allow a free choice of the slot for any desired pluggable unit, in this case plug-in contacts of the same name of each mating plug-in contact device are usually connected to one another in the manner of a parallel bus. For this purpose, the pluggable electrical units are of an identical mechanical type of construction and are configured with an identical electrical interface designed for the plug-in contact device.

Such backplane wiring in the manner of a parallel bus no longer allows individualizing of the electrical interface of the pluggable electrical units that is designed for the plug-in contact device, since plug-in contacts of the same name would be wired to different types of signals, which may also differ in the direction of signal transmission. If the free choice of slots is maintained for all the pluggable electrical units, the number of necessary plug-in contacts increases in proportion to the degree of individualization of the pluggable electrical units, and so does the complexity of the backplane wiring. This additional complexity is felt to be disadvantageous. In addition, the overall size of the plug-in connector increases with the number of pins. Plug-in connectors of a larger overall size are at odds with the miniaturization of pluggable electrical units.

SUMMARY OF THE INVENTION

The invention is therefore based on the object of specifying means which make the free choice of slots for pluggable electrical units of an identical mechanical type of construction with different electrical interfaces designed for the plug-in contact device possible in a modular system with little expenditure.

The invention is based on a modular system comprising an electrical base unit with a plurality of slots each for receiving a pluggable electrical unit, each pluggable electrical unit being electrically connected to the base unit by means of a multi-pin plug-in connection comprising a plug-in contact device and a mating plug-in contact device and the base unit being provided with signal processing means.

The essence of the invention is to divide the plug-in contacts of the multi-pin plug-in connection into at least two groups, a first group of plug-in contacts being intended for the connection of permanently configured lines for the identification of the pluggable electrical unit and a second group of plug-in contacts being intended for the connection of freely configurable lines for the communication of the pluggable electrical unit with the base unit, the direction of signal transmission and the logical signal assignment of these lines being predeterminable slot-specifically in accordance with the identity of the pluggable electrical unit and able to be set as prescribed by the signal processing means of the base unit.

The signal processing means of the base unit comprise a microcontroller circuit with a plurality of input/output terminals, which can be configured as address terminals, as data terminals and as control terminals. The plug-in contacts of the second group are respectively connected to an input/output terminal of the microcontroller circuit of the base unit.

Each pluggable electrical unit is provided with identifiers which clearly identify this unit and can be read out by the base unit via the predefined identification lines of the first group. The identifying identifiers of all the pluggable electrical units coming into consideration for the system are stored in the base unit. In accordance with detected identifying identifiers of a pluggable electrical unit at a given slot, the communication lines of the second group routed via the same plug-in connection are individually configured for this slot and activated as need be.

In this way, a high degree of variability is achieved with a small number of plug-in contacts in every plug-in connection, and a free choice of slots is made possible for pluggable electrical units of an identical mechanical type of construction with different electrical interfaces designed for the plug-in contact device.

According to a further feature of the invention, a third group of plug-in contacts is intended for the connection of permanently configured lines for the communication of the pluggable electrical unit with the base unit. Signal lines of the same type of all pluggable electrical unit can advantageously be routed via the plug-in contacts of the third group.

All the plug-in contacts of the same name of the third group are respectively connected to one another and to an input/output terminal of the microcontroller circuit of the base unit.

The pluggable electrical unit has a serial read-only memory, which is connected to the permanently configured lines of the first group of plug-in contacts. The identifiers for the identification of the pluggable electrical unit are stored in the read-only memory and can be read for the signal processing means of the base unit.

The pluggable electrical unit has a microcontroller, which is connected to the second and third groups of plug-in contacts. In accordance with the identity of the respective pluggable electrical unit, the individually configured terminals of the microcontroller are connected to plug-in contacts of the second group in a way corresponding to the logical signal assignment and direction of signal transmission. In addition, further terminals of the microcontroller are connected to plug-in contacts of the third group such that they are configured in a way corresponding to the direction of signal transmission and logical signal assignment identical for all pluggable electrical units.

According to a further feature of the invention, it is provided that individual configuration data of the pluggable electrical unit are stored in the serial read-only memory. Like the identifiers for the identification of the signal processing means of the base unit, these configuration data can be read slot-individually.

This advantageously makes it possible for non-system pluggable electrical units to be integrated, in that the individual configuration data of the pluggable electrical unit are read out and the communication lines routed via the second group of plug-in contacts are configured individually for this slot in a way corresponding to the configuration data read.

BRIEF DESCRIPTION OF THE DRAWINGS

The invention is explained in more detail below on the basis of an exemplary embodiment. In the drawings required for this purpose.

DETAILED DESCRIPTION OF THE PREFERRED EMBODIMENTS

Figure 1:
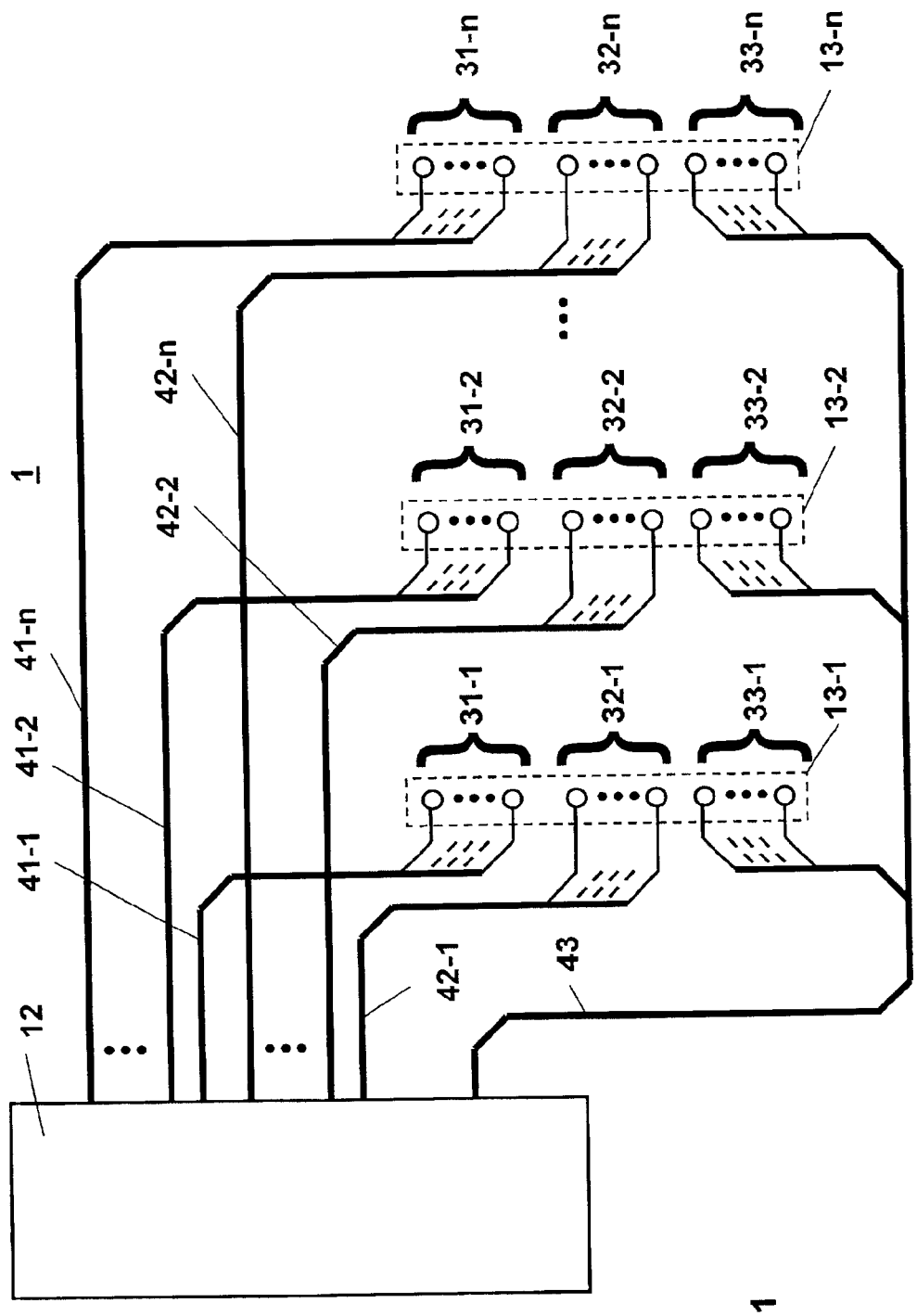
FIG. 1 shows a basic diagram of the wiring of the base unit

Represented in FIG. 1 is a basic diagram of the wiring of a base element 1 with n slots each for receiving a pluggable electrical unit. Each slot is provided with a multi-pin mating plug-in contact device 13-1, 13-2 to 13-n. The mating plug-in contact devices 13-1, 13-2 to 13-n are of the same type and have plug-in contacts which are divided into groups. Plug-in contacts of the same name of each mating plug-in contact device 13-1, 13-2 to 13-n belong to the same group.

Connected to a first group 31-1, 31-2 to 31-n of plug-in contacts of the mating plug-in contact devices 13-1, 13-2 to 13-n there are in each case permanently configured lines 411, 41-2 to 41-n for the identification of the pluggable electrical unit at the respective slot. For each plug-in contact of the first group 31-1, 31-2 to 31-n of plug-in contacts of each mating plug-in contact device 13-1, 13-2 to 13-n, the logical signal assignments and the directions of signal transmission are permanently prescribed and are identical over all the slots for plug-in contacts each of the same name.

The plug-in contacts of a second group 32-1, 32-2 to 32-n of plug-in contacts of the mating plug-in contact devices 13-1, 13-2 to 13-n are in each case connected to individually configurable lines 42-1, 42-2 to 42-n for the communication of the pluggable electrical unit with the base unit 1. For each plug-in contact of the second group 32-1, 32-2 to 32-n of plug-in contacts of each mating plug-in contact device 13-1, 13-2 to 13-n, the logical signal assignments and the directions of signal transmission can be configured slot-individually in accordance with the identity of the pluggable electrical unit at this slot.

In this way, a particular plug-in contact of the second group 32-1 of plug-in contacts of the first mating plug-in contact device 13-1 can be configured in a way corresponding to the identity of the pluggable electrical unit at the first slot for bidirectional data transmission between the pluggable electrical unit at the first slot with the base unit 1, while the plug-in contact of the same name of the second group 32-2 of plug-in contacts of the second mating plug-in contact device 13-2 is configured in a way corresponding to the identity of the pluggable electrical unit at the second slot for the transmission of a unidirectionally directed control signal to the pluggable electrical unit. Following an exchange of the two pluggable electrical units at the first and second slots, the plug-in contact of the second group 32-1 of plug-in contacts of the first mating plug-in contact device 13-1 is configured in a way corresponding to the new identity of the pluggable electrical unit at the first slot for the transmission of a unidirectionally directed control signal to the pluggable electrical unit and the plug-in contact of the same name of the second group 32-2 of plug-in contacts of the second mating plug-in contact device 13-2 is configured in a way corresponding to the new identity of the pluggable electrical unit at the second slot for bidirectional data transmission between the pluggable electrical unit at the second slot and the base unit 1.

In addition, each mating plug-in contact device 13-1, 13-2 to 13-n has a third group 33-1, 33-2 to 33-n of plug-in contacts, to which permanently configured lines 43 for the communication of the pluggable electrical unit with the base unit 1 are connected. In this case, plug-in contacts of the same name of the third group 33-1, 33-2 to 33-n of plug-in contacts of all the mating plug-in contact devices 13-1, 13-2 to 13-n are connected to one another. For each plug-in contact of the third group 33-1, 33-2 to 33-n of plug-in contacts of each mating plug-in contact device 13-1, 13-2 to 13-n, the logical signal assignments and the directions of signal transmission are permanently prescribed and are identical over all the slots for plug-in contacts each of the same name.

The base unit 1 is provided with signal processing means 12. The signal processing means 12 of the base unit 1 comprise a microcontroller circuit with a plurality of input/output terminals, which can be configured as address terminals, as data terminals and as control terminals. Microcontrollers of this type are known per se. For example, the type 80C517 is equipped with 56 digital input/output terminals, which are grouped together in seven bidirectional 8-bit ports. Each of these 56 port terminals can itself be configured as desired as an input or output terminal. By alternately successive configuration as an input terminal and output terminal, each port terminal can be set as a bidirectional terminal for successive reading and writing. In addition, the microcontroller has control-signal terminals of a predetermined and unalterable logical signal assignment and direction of signal transmission.

The permanently configured lines 41-1, 41-2 to 41-n for the identification of the pluggable electrical unit at the respective slot are connected in each case to one of the port terminals. In accordance with the type of identification, it may be envisaged to combine lines of identical logical signal assignment and direction of signal transmission of different slots and connect them to the same port terminal. Dependent on the number of connected slots, what are known as line drivers, known per se, can be connected into the lines 41-1, 41-2 to 41-n. In addition, it may be envisaged to realize the individualization of lines 41-1, 41-2 to 41-n by interposed logical signal-combining modules.

The individually configurable lines 42-1, 42-2 to 42-n for the communication of the pluggable electrical unit with the base unit I are in each case separately connected to a port terminal. The port terminals are individually configured in a way corresponding to the identity of the pluggable electrical unit at the respective slot and the associated logical signal assignment and direction of signal transmission as an input terminal for reading or an output terminal for writing or, by alternately successive configuration as an input terminal and output terminal, as a bidirectional terminal for successive reading and writing.

The permanently configured lines 43 for the communication of the pluggable electrical unit with the base unit 1 are connected uniformly for all slots in a way corresponding to the associated logical signal assignments and directions of signal transmission to port terminals or control-signal terminals of the microcontroller. In this case, it may be envisaged to connect one of the permanently configured lines 43 to the read/write signal terminal of the microcontroller determining the direction of signal transmission of the communication of the pluggable electrical unit with the base unit 1.

In addition, it may be envisaged to connect individual permanently configured lines 43 by interposed logical signal-combining modules to terminals of the microcontroller. In this case it may be envisaged to combine interrupt-request signals of the pluggable electrical units by the interposed logical signal-combining modules and switch the resultant interrupt-request signal to an interrupt-request signal terminal of the microcontroller.

Dependent on the number of connected slots, what are known as line drivers, known per se, may be connected into the lines 43.

Figure 2:
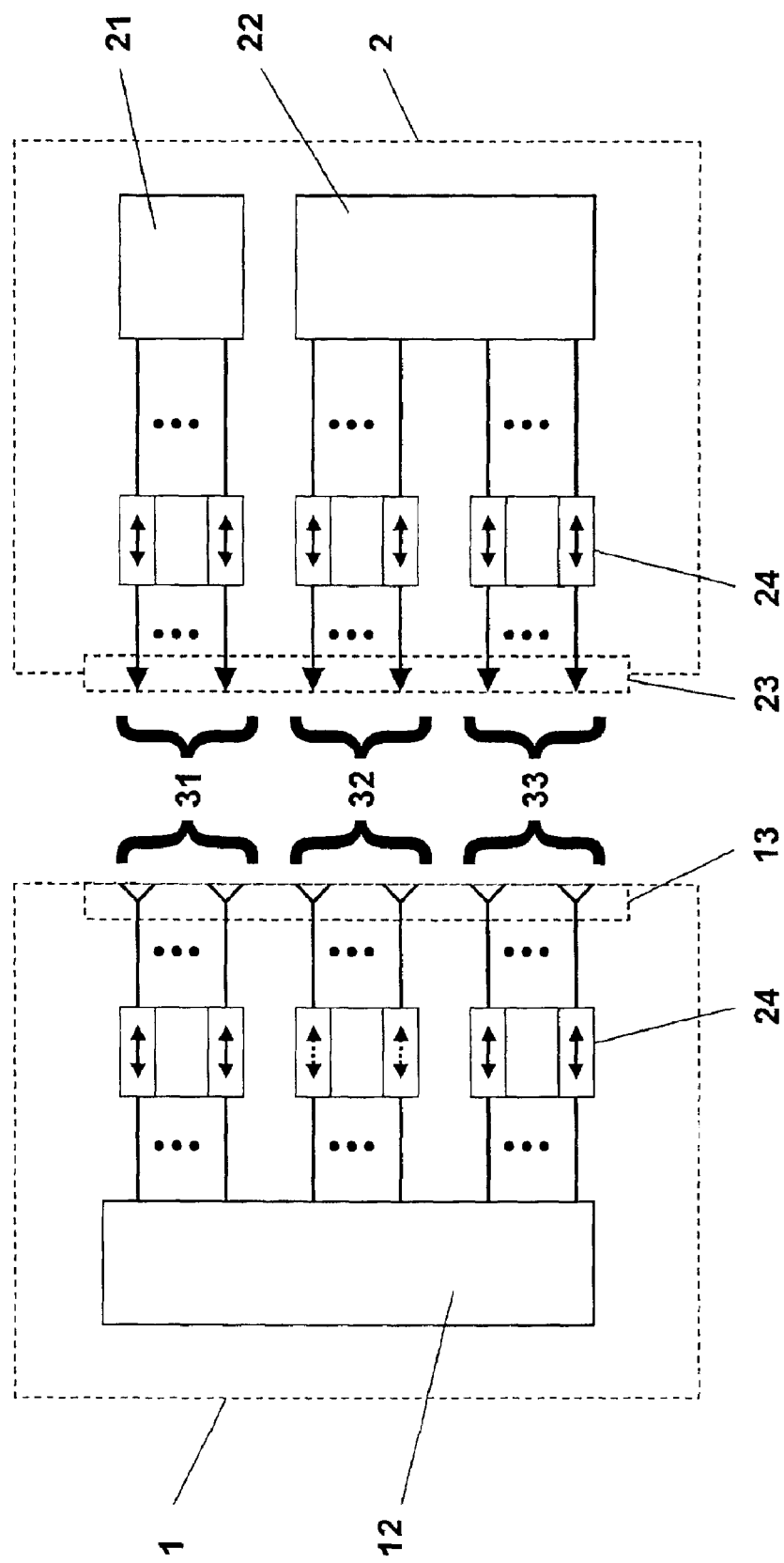
FIG. 2 shows a basic diagram of slot-related contact assignment

Represented in FIG. 2 is a basic diagram of slot-related contact assignment for any desired slot of the base unit 1 and a pluggable electrical unit 2. The plug-in contacts of the mating plug-in contact devices 13 are divided into three groups 31, 32 and 33 and connected to the signal processing means 12. Connected to the first group 31 of plug-in contacts of the mating plug-in contact devices 13 there are in each case permanently configured lines, which are identified by a solid double arrow in the respective interface 24, for the identification of the pluggable electrical unit 2 at the respective slot. The plug-in contacts of the second group 32 are in each case connected to individually configurable lines, which are identified by a dotted double arrow in the respective interface 24, for the communication of the pluggable electrical unit 2 with the base unit 1. The plug-in contacts of the third group 33 are connected in each case to permanently configured lines, which are identified by a solid double arrow in the respective interface 24, for the communication of the pluggable electrical unit 2 with the base unit 1.

The pluggable electrical unit 2 is provided with a plug-in contact device 23, corresponding to the mating plug-in contact device 13, for the electrical connection of the pluggable electrical unit 2 to the base unit 1. The groups 31, 32 and 33 of plug-in contacts of the mating plug-in contact device 13 are designed for the plug-in contact device 23.

The pluggable electrical unit 2 is provided with a read-only memory 21, which is connected to the plug-in contacts of the first group 31 of plug-in contacts of the plug-in contact device 23. In this read-only memory 21, identifiers for the identification of the pluggable electrical unit 2 are stored. In a preferred configuration, this read-only memory 21 is of the serial type and is electrically programmable.

Serial electrically programmable read-only memories are known per se and are commercially available, for example under the designation 24C04 of the Microchip company.

Serial read-only memories manage with a comparatively small number of terminals irrespective of the storage capacity, with the result that the number of plug-in contacts comprised by the first group 31 remains small.

In a particularly advantageous configuration, the serial electrically programmable read-only memory 21 is provided with an integrated I²C bus interface. The physical layer of the I²C bus defined by the PHILIPS company comprises precisely two lines. Irrespective of the storage capacity of the read-only memory 21, the first group 31 consequently comprises precisely two plug-in contacts.

Serial electrically programmable read-only memories with an integrated I²C bus interface are known per se and are commercially available, for example under the designation 24C04 of the Microchip company.

The pluggable electrical unit 2 is also provided with a microcontroller 22 with a plurality of input/output terminals, which can be configured as address terminals, as data terminals and as control terminals. In addition, the microcontroller 22 has control-signal terminals of predetermined and unalterable logical signal assignment and direction of signal transmission.

The plug-in contacts of the second group 32 are connected to input/output terminals of the microcontroller 22 and are individually configured permanently in their logical signal assignment and direction of signal transmission in a way corresponding to the identity of the respective pluggable electrical unit 2. Accordingly, by contrast with the corresponding interfaces 24 of the base unit 1, the associated interfaces 24 of the pluggable electrical unit 2 are identified by a solid double arrow.

The plug-in contacts of the third group 33 are connected in a way corresponding to their logical signal assignment and direction of signal transmission to input/output terminals or control-signal terminals of the microcontroller 22. In this case, it may be envisaged to connect individual plug-in contacts of the third group 33 by interposed logical signal-combining modules to terminals of the microcontroller. The logical signal assignments and directions of signal transmission at the plug-in contacts of the third group 33 are identical and permanently configured for all pluggable electrical units 2.

A pluggable electrical unit 2 added to the system is identified by reading in the identifiers for the identification of the pluggable electrical unit 2 from the read-only memory 21 via the plug-in contacts of the first group 31 and also the permanently configured lines 41 into the signal processing means 12. In accordance with the detected identity of the pluggable electrical unit 2, the port terminals for the individually configurable lines 42 are configured slot-dependently in a way corresponding to the associated logical signal assignments and directions of signal transmission.

For this purpose, it may be provided that the identifying identifiers of all the pluggable electrical units 2 coming into consideration for the system and the associated logical signal assignments and directions of signal transmission are stored in the signal processing means 12 of the base unit 1. In this embodiment, once the pluggable electrical units 2 have been identified, the base unit 1 has all the necessary information for the configuration of the port terminals connected to the individually configurable lines 42.

In addition or alternatively, it may also be provided that not only the identifiers for the identification but also the associated individual logical signal assignments and directions of signal transmission of the pluggable electrical unit 2 are stored in the read-only memory 21 of the pluggable electrical unit 2.

In this embodiment, once the pluggable electrical unit 2 has been identified, the associated individual logical signal assignments and directions of signal transmission are read from the read-only memory 21 into the signal processing means 12 of the base unit 1 for the configuration of the port terminals connected to the individually configurable lines 42. Then, the base unit 1 has all the necessary information for the configuration of the port terminals connected to the individually configurable lines 42.

This embodiment is particularly suitable for the integration of subsequently defined pluggable electrical units 2 and for the manufacturer-independent combination of components in a modular system.

It is to be understood that the description of the preferred embodiment(s) is (are) intended to be only illustrative, rather than exhaustive, of the present invention. Those of ordinary skill will be able to make certain additions, deletions, and/or modifications to the embodiment(s) of the disclosed subject matter without departing from the spirit of the invention or its scope, as defined by the appended claims.

What is claimed is:

1. A modular system comprising an electrical base unit with a plurality of slots each for receiving a pluggable electrical unit, each pluggable electrical unit being electrically connected to the base unit by means of a multi-pin plug-in connection comprising a plug-in contact device and a mating plug-in contact device and the base unit being provided with signal processing means, wherein for each multi-pin plug-in connection:

plug-in contacts of the multi-pin plug-in connection (13, 23) are divided into at least two groups (31, 32), a first group (31) of plug-in contacts provides for the connection of a permanently configured line (41) for the identification of the pluggable electrical unit (2) and a second group (32) of plug-in contacts provides for the connection of a freely configurable line (42) for the communication of the pluggable electrical unit (2) with the base unit (1), the direction of signal transmission and the logical signal assignment of the freely configurable line being determined in accordance with the identity of the pluggable electrical unit (2) by the signal processing means (12).

2. System The system according to claim 1, wherein for each multi-pin plug-in connection, a third group (33) of plug-in contacts is for the connection of a permanently configured line (43) for the communication of the pluggable electrical unit (2) with the base unit (1).

3. The system of claim 2 wherein for each multi-pin plug-in connection, said pluggable electrical unit has a microcontroller, which is connected to the second and third groups of plug-in contacts.

4. The system according to claim 1, wherein for each multi-pin plug-in connection, the pluggable electrical unit (2) has a serial read-only memory (21), which is connected to the permanently configured line (41) of the first group (31) of plug-in contacts and which has identifiers for the identification of the pluggable electrical unit (2).

5. The system according to claim 4, wherein individual configuration data of the pluggable electrical unit (2) are stored in the serial read-only memory (21).

6. A modular system comprising:

a plurality of pluggable electrical units, each having an identification and a contact device;

an electrical base unit comprising:

a signal processing means;

a plurality of base contact devices for pluggable connection to the contact devices of the pluggable electrical units, respectively, each of said base contact devices being connected to the signal processing means and comprising a first group of contacts and a second group of contacts; and wherein for each base contact device, the identification of the pluggable electrical unit connected to the contact device is conveyed to the signal processing means through the first group of contacts;

wherein for each base contact device, communication between the pluggable electrical unit connected to the base contact device and the signal processing means is conveyed through the second group of contacts; and wherein for each base contact device, the direction of signal transmission and the logical signal assignment for each contact of the first group of contacts are fixed and the direction of signal transmission and the logical signal assignment for each contact of the second group of contacts is configured by the signal processing means based on the identity of the pluggable electrical unit connected to the base contact device.

7. The system of claim 6, wherein each of the base contact devices of the base unit further comprises a third group of contacts and wherein for each base contact device, the direction of signal transmission and the logical signal assignment of each contact of the third group of contacts is fixed.

8. The system of claim 7, wherein in each of the pluggable electrical units, the contact device comprises first, second and third groups of contacts for respective connection to the first, second and third groups of contacts of the base contact device that is connected to the contact device.

9. The system of claim 8, wherein each of the pluggable electrical units further comprises:

a serial read-only memory connected to the first group of contacts of the contact device, said serial read-only memory storing the identification of the pluggable electrical unit; and a microcontroller having input/output terminals connected to the second and third groups of contacts of the contact device.

10. The system of claim 9, wherein in each of the pluggable electrical units, the direction of signal transmission and the logical signal assignment for each contact of the second group of contacts are fixed and are based on the identity of the pluggable electrical unit.

11. The system of claim 9, wherein in each of the pluggable electrical units, the first group of contacts consists of two contacts.

12. The system of claim 7, wherein the third groups of contacts of the base unit are connected together and the directions of signal transmission and the logical signal assignments for the third group of contacts are identical for each of the base contact devices.

13. The system of claim 6, wherein the base unit has a plurality a slots for receiving the pluggable electrical units, respectively, said slots being provided with the base contact devices, respectively.

* * * * *